United States Patent
Panther et al.

(10) Patent No.: US 9,529,068 B2
(45) Date of Patent: Dec. 27, 2016

(54) SYSTEM AND METHOD FOR IMAGE WARP CORRECTION FOR MAGNETIC RESONANCE IMAGING

(71) Applicants: Alexander Gyles Panther, Toronto (CA); Chad Tyler Harris, Toronto (CA); Phillip J. Beatty, Toronto (CA)

(72) Inventors: Alexander Gyles Panther, Toronto (CA); Chad Tyler Harris, Toronto (CA); Phillip J. Beatty, Toronto (CA)

(73) Assignee: SYNAPTIVE MEDICAL (BARBADOS) INC., Bridgetown (BB)

( * ) Notice: Subject to any disclaimer, the term of this patent is extended or adjusted under 35 U.S.C. 154(b) by 0 days.

(21) Appl. No.: 14/903,636

(22) PCT Filed: Apr. 27, 2015

(86) PCT No.: PCT/IB2015/053059
§ 371 (c)(1),
(2) Date: Jan. 8, 2016

(65) Prior Publication Data
US 2016/0313434 A1    Oct. 27, 2016

(51) Int. Cl.
*G01R 33/565* (2006.01)
*G01R 33/48* (2006.01)

(52) U.S. Cl.
CPC ..... *G01R 33/56572* (2013.01); *G01R 33/4818* (2013.01)

(58) Field of Classification Search
CPC ............... G01R 33/56572; G01R 33/4818
(Continued)

(56) References Cited

U.S. PATENT DOCUMENTS 6,278,275 B1 * 8/2001 Petropoulos ......... G01R 33/385
324/309
6,707,300 B2    3/2004 Polzin et al.
(Continued)

OTHER PUBLICATIONS

Wang et al., "A novel phantom and method for comprehensive 3-dimensional measurement and correction of geometric distortion in magnetic resonance imaging", Magn Reson Imaging 2004; 22:529-542.
(Continued)

*Primary Examiner* — Melissa Koval
*Assistant Examiner* — Rishi Patel
(74) *Attorney, Agent, or Firm* — Perry + Currier Inc.

(57) ABSTRACT

A method of correcting warping of an acquired image in an MRI system, caused by non-linearities in gradient field profiles of gradient coils is set forth, comprising a) constructing a computer model representing conducting pathways for each gradient coil in said MRI system; b) calculating a predicted magnetic field at each point in space for each said gradient coil in said model; c) measuring actual magnetic field at each point in space for each said gradient coil in said MRI system; d) verifying accuracy of said model by comparing said predicted magnetic field to said actual magnetic field at each said point in space and in the event said model is not accurate then repeating a)-d), and in the event said model is accurate then; constructing a distortion map for mapping coordinates in real space to coordinates in warped space of said acquired image based on deviations of said predicted magnetic field from linearity; and unwarping said warping of the acquired image using said distortion map.

16 Claims, 10 Drawing Sheets

(58) Field of Classification Search
USPC .................................................. 324/300–322
See application file for complete search history.

(56) References Cited

U.S. PATENT DOCUMENTS

| | | | |
|---|---|---|---|
| 6,969,991 B2 | 11/2005 | Bammer et al. | |
| 2005/0218892 A1* | 10/2005 | Pruessmann | G01R 33/24 |
| | | | 324/307 |
| 2007/0090838 A1* | 4/2007 | Hennig | G01R 33/385 |
| | | | 324/307 |
| 2008/0054899 A1* | 3/2008 | Aksoy | G01R 33/5611 |
| | | | 324/307 |

OTHER PUBLICATIONS

Viard et al., "Characterization and 3D correction of geometric distortion in lowfield open-magnet MRI", 30th Annual International IEEE EMBS Conference 2008.
Langlois et al, "MRI Geometric Distortion: a simple approach to correcting the effects of non-linear gradient fields".
Janke et al., "Use of Spherical Harmonic Deconvolution Methods to Compensate for Nonlinear Gradient Effects on MRI Images", Magn Reson in Medicine 2004; 52:115-122.
Doran et al., "A complete distortion correction for MR images: I. Gradient warp correction", Physics in Medicine and Biology 2005; 50:1343-1361.
Chen et al., "Investigation of MR image distortion for radiotherapy treatment planning of prostate cancer", Physics in Medicine and Biology 2006; 51:1393-1403.
Gilbert et al., "A cradle-shaped gradient coil to expand the clear-bore width of an animal MRI scanner", Physics in Medicine and Biology 2010; 55:497-514.
International Search Report, Dec. 18, 2015, PGT/IB2015/053059.

* cited by examiner

SYSTEM AND METHOD FOR IMAGE WARP CORRECTION FOR MAGNETIC RESONANCE IMAGING

FIELD OF THE INVENTION

The present invention relates generally to magnetic resonance imaging. More specifically, the present invention relates to image warping due to gradient coil non-linearities.

BACKGROUND OF THE INVENTION

Magnetic resonance imaging (MRI) is a major imaging technique used in medicine. MRI is capable of generating detailed images of soft tissues such as the brain, muscles and kidneys. Specific properties of the various compounds found inside tissues, such as water and/or fat, are used to generate images. For example, when subjected to a strong magnetic field, the vector sum of the nuclear magnetic moments of a large number of atoms possessing a nuclear spin angular momentum, such as hydrogen, which is abundant in water and fat, will produce a net magnetic moment in alignment with the externally applied field. The resultant net magnetic moment can furthermore precess with a well-defined frequency that is proportional to the applied magnetic field. After excitation by radio frequency pulses, the net magnetization thus allows a detectable signal to be generated.

The signal generated can be encoded using various mechanisms to allow conversion to spatial images. For example, gradient coils (high power electromagnets) are used to encode spatial information. The spatial encoding is achieved by causing the gradient coils to produce a linearly varying magnetic field with position in an imaging volume within which the image to be scanned is placed. In real world implementations, the field profiles produced by the gradient coils deviate from strictly linear. The amount of deviation depends on spatial position within the image. The deviation from a strictly linear field leads to a spatial warping of the acquired image. Accordingly, there is a need to undo the image warping or "unwarp" the acquired images during processing of the acquired imaging data.

SUMMARY OF THE INVENTION

It is an object to provide a novel system and method for an MRI scanning system and method that obviates and mitigates at least one of the above-identified disadvantages of the prior art.

According to an aspect of this specification, a method of correcting warping of an acquired image in an MRI system, caused by non-linearities in gradient field profiles of gradient coils is set forth, comprising:
 a) constructing a computer model representing conducting pathways for each gradient coil in said MRI system;
 b) calculating a predicted magnetic field at each point in space for each said gradient coil in said model;
 c) measuring actual magnetic field at each point in space for each said gradient coil in said MRI system;
 d) verifying accuracy of said model by comparing said predicted magnetic field to said actual magnetic field at each said point in space and in the event said model is not accurate then repeating a)-d), and in the event said model is accurate then;
 e) constructing a distortion map for mapping coordinates in real space to coordinates in warped space of said acquired image based on deviations of said predicted magnetic field from linearity; and
 f) unwarping said warping of the acquired image using said distortion map.

These, together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION

Traditional magnetic resonance imaging (MRI) systems represent an imaging modality which is primarily used to construct pictures of magnetic resonance (MR) signals from protons such as hydrogen atoms in an object. In medical MRI, typical signals of interest are MR signals from water and fat, the major hydrogen containing components of tissues.

Figure 1:
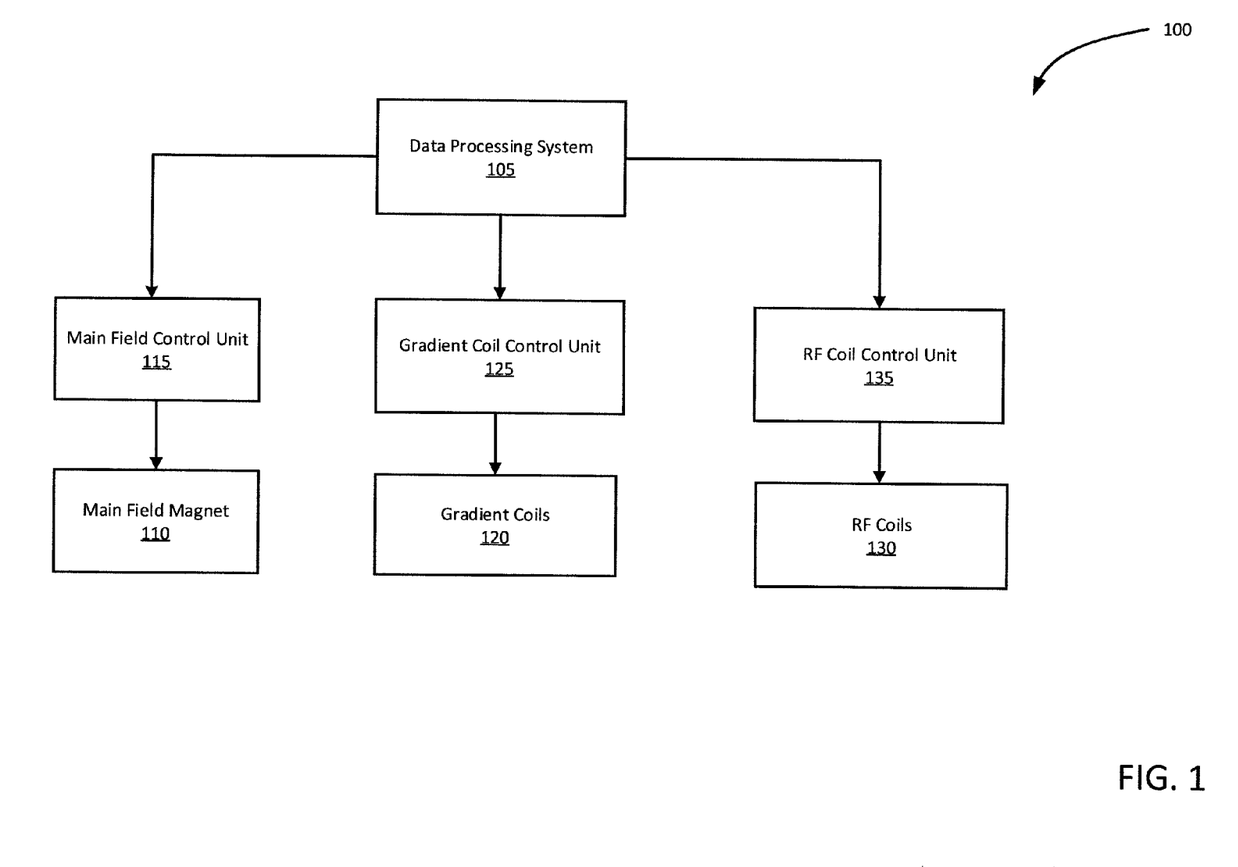
FIG. 1 shows a block diagram of functional subsystems of a magnetic resonance imaging (MRI) system in accordance with an implementation.

Referring to FIG. 1, a block diagram of a magnetic resonance imaging (MRI) system, in accordance with an example implementation, is shown at 100. The example implementation of MRI system indicated at 100 is for illustrative purposes only, and variations including additional, fewer and/or varied components are possible.

As shown in FIG. 1, the illustrative MRI system 100 comprises a data processing system 105. The data processing system 105 can generally include one or more output devices such as a display, one or more input devices such as a keyboard and a mouse as well as one or more processors connected to a memory having volatile and persistent components. The data processing system 105 may further comprise one or more interfaces adapted for communication and data exchange with the hardware components of MRI system 100 used for performing a scan.

Continuing with FIG. 1, example MRI system 100 also includes a main field magnet 110. The main field magnet 110 may be implemented as a permanent, superconducting or a resistive magnet, for example. Other magnet types, including hybrid magnets suitable for use in MRI system 100 will now occur to a person of skill and are contemplated. Main field magnet 110 is operable to produce a substantially uniform main magnetic field having a strength B0 and a direction along an axis. The main magnetic field is used to create an imaging volume within which desired atomic nuclei, such as the protons in hydrogen within water and fat, of an object are magnetically aligned in preparation for a scan. In some implementations, as in this example implementation, a main field control unit 115 in communication with data processing system 105 may be used for controlling the operation of main field magnet 110.

MRI system 100 further includes gradient coils 120 used for encoding spatial information in the main magnetic field along, for example, three perpendicular gradient axis. The size and configuration of the gradient coils 120 may be such that they produce a controlled and uniform linear gradient. For example, three paired orthogonal current-carrying primary coils located within the main field magnet 110 may be designed to produce desired linear-gradient magnetic fields.

In some implementations, gradient coils 120 may be shielded and include an outer layer of shield coils which can produce a counter magnetic field to counter the gradient magnetic field produced by the primary gradient coils forming a primary-shield coils pair. In such a coil pair the "primary" coils can be responsible for creating the gradient field and the "shield" coils can be responsible for reducing the stray field of the primary coil outside a certain volume such as an imaging volume. The primary and shield coils of the gradient coils 120 may be connected in series. It is also possible to have more than two layers of coils for any given gradient axis that together form a shielded gradient coil. Shielded gradient coils 120 may reduce eddy currents and other interference which can cause artifacts in the scanned images. Since eddy currents mainly flow in conducting components of the MRI system 100 that are caused by magnetic fields outside of the imaging volume (fringe fields), reducing the fringe fields produced by gradient coils 120 may reduce interference. Accordingly, the shapes and sizes, conductor wire patterns and sizes, and current amplitudes and patterns of the primary-shield coils pair can be selected so that the net magnetic field outside the gradient coils 120 is as close to zero as possible. For cylindrical magnets, for example, the two coils may be arranged in the form of concentric cylinders whereas for vertical field magnets, the two coils may be arranged in coaxial disks.

The conductive components of the gradient coils 120, whether shielded or unshielded and including the primary and shield coils, may consist of an electrical conductor (for example copper, aluminum, etc.). The internal electrical connections can be such that when a voltage difference is applied to the terminals of the gradient coils 120, electric current can flow in the desired path. The conductive components for the three gradient axes for both the primary gradient coils and the gradient shield coils may be insulated by physical separation and/or a non-conductive barrier.

The magnetic fields produced by the gradient coils 120, in combination and/or sequentially, can be superimposed on the main magnetic field such that selective spatial excitation of objects within the imaging volume occurs. In addition to allowing spatial excitation, the gradient coils 120 may attach spatially specific frequency and phase information to the atomic nuclei placed within the imaging volume, allowing the resultant MR signal to be reconstructed into a useful image. A gradient coil control unit 125 in communication with data processing system 105 is used to control the operation of gradient coils 120.

In some implementations of MRI system 100, there may be additional electromagnet coils present (not shown), such as shim coils (traditionally, but not limited to, producing magnetic field profiles of 2nd order or higher spherical harmonics) or a uniform field offset coil or any other corrective electromagnet. To perform active shimming (correcting the field distortions that are introduced when different objects are placed within or around the system), the corrective electromagnets, such as the shim coils, carry a current that is used to provide magnetic fields that act to make the main magnetic field more uniform. For example, the fields produced by these coils may aid in the correction of inhomogeneities in the main magnetic field due to imperfections in the main magnet 110, or to the presence of external ferromagnetic objects, or due to susceptibility differences of materials within the imaging region, or any other static or time-varying phenomena.

The MRI system 100 further comprises radio frequency (RF) coils 130. The RF coils 130 are used to establish an RF magnetic field with a strength B1 to excite the atomic nuclei or "spins". The RF coils 130 can also detect signals emitted from the "relaxing" spins within the object being imaged. Accordingly, the RF coils 130 may be in the form of separate transmit and receive coils or a combined transmit and receive coil with a switching mechanism for switching between transmit and receive modes.

The RF coils 130 may be implemented as surface coils, which are typically receive only coils and/or volume coils which can be receive and transmit coils. RF coils 130 can be integrated in the main field magnet 110 bore. Alternatively, RF coils 130 may be implemented in closer proximity to the object to be scanned, such as a head, and can take a shape that approximates the shape of the object, such as a close-fitting helmet. An RF coil control unit 135 in communication with data processing system 100 may be used to control the operation of the RF coils 130 in either a transmit aspect or a receive aspect.

There are many techniques for obtaining images using a MRI system 100, including T1 and T2 weighted images. To provide a simplified illustration of MRI system 100's functionality, simplified operations for obtaining proton density-weighted images are described as a non-limiting example. To create an image in accordance with the example illustration, MRI system 100 detects the presence of atomic nuclei containing spin angular momentum in an object, such as those of hydrogen protons in water or fat found in tissues, by subjecting the object to a relatively large magnetic field. In this example implementation, the main magnetic field has a strength of B0 and the atomic nuclei containing spin angular momentum may be hydrogen protons. The main magnetic field partially polarizes the hydrogen protons in the object placed in the imaging volume of the main magnet 110. The protons are then excited with appropriately tuned RF radiation, forming an RF magnetic field with a strength of B1, for example. Finally, a weak RF radiation signal from the excited protons is detected as an MR signal, as the protons "relax" from the magnetic interaction. The frequency of the detected MR signal (the Larmor frequency) is proportional to the strength of the magnetic field to which the protons are subjected.

Cross-sections of the object from which to obtain signals may be selected by producing a magnetic field gradient across the object so that magnetic field values of the main magnetic field can be varied along various locations in the object. Given that the signal frequency is proportional to the varied magnetic field created, the variations allow assigning a particular signal frequency and phase to a location in the object. Accordingly, sufficient information can be found in the obtained MR signals to construct a map of the object in terms of proton presence, which is the basis of a traditional MRI image. For example, since proton density varies with the type of tissue, tissue variations may be mapped as image contrast variations after the obtained signals are processed.

Figure 2:
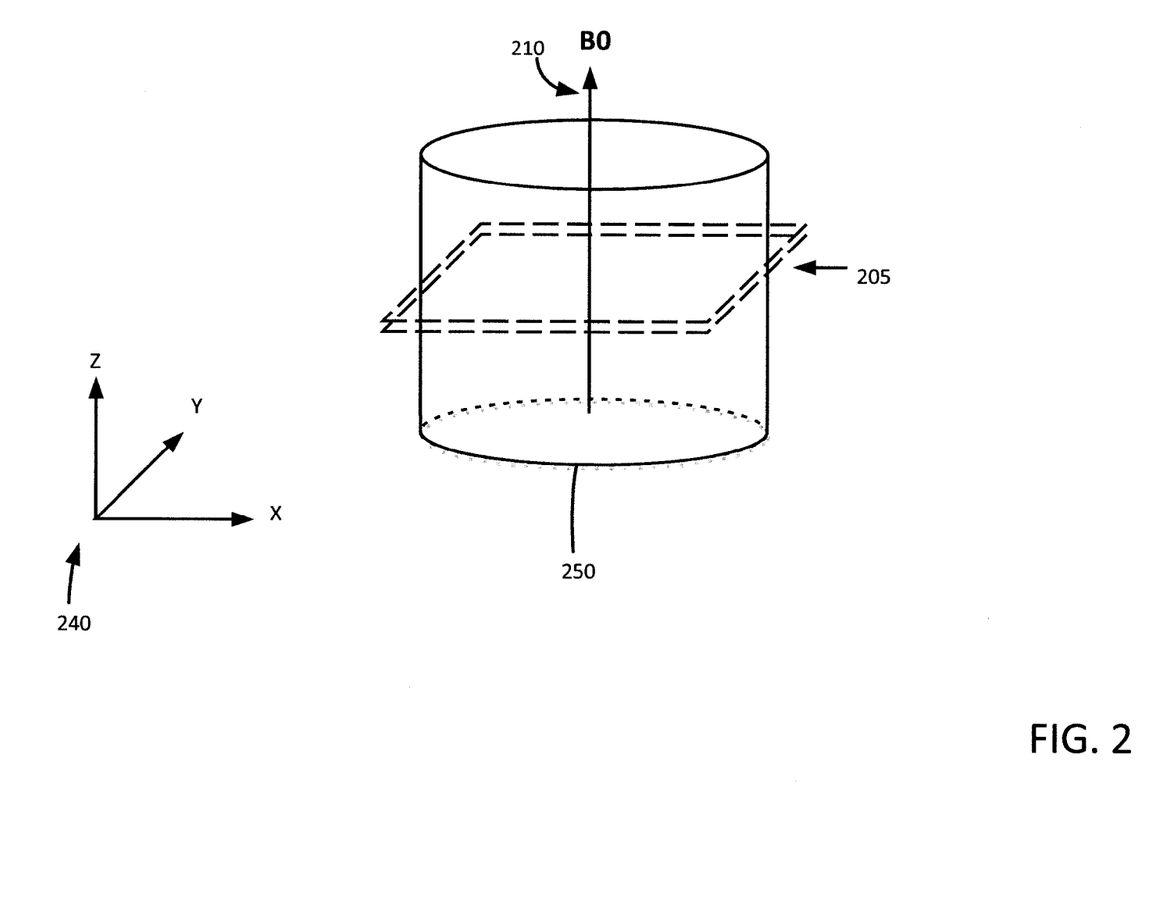
FIG. 2 shows an imaging volume and corresponding slice to be scanned by the MRI system of FIG. 1 in accordance with an implementation.

Referring now to FIG. 2, to further illustrate the example signal acquisition process by the MRI system 100, consider an object placed within an imaging volume 250 of the main magnet 110 having a main magnetic field 210 with a strength B0, pointing along the Z-axis indicated at 240, resulting in a net magnetization vector. In this illustrative example, a slice of the object in a plane along the X and Y axes, as indicated at 205, is being imaged. It should be noted that in this example, the slice has a finite thickness along the Z-axis, creating a volumetric slice 205.

To obtain images from the MRI system 100, one or more sets of RF pulses and gradient waveforms (collectively called "pulse sequences") are selected at the data processing system 105. The data processing system 105 passes the selected pulse sequence information to the RF control unit 135 and the gradient control unit 125, which collectively generate the associated waveforms and timings for providing a sequence of pulses to perform a scan.

Figure 3:
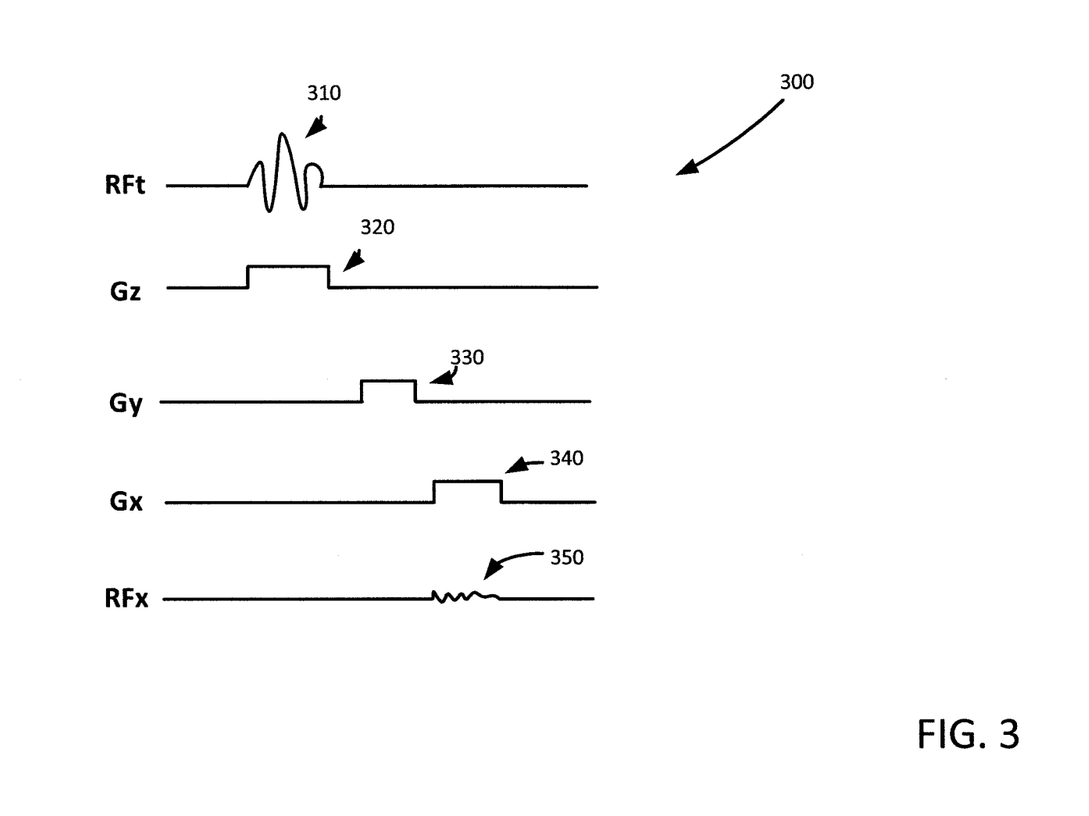
FIG. 3 shows a simplified pulse sequence that may be used by the MRI system of FIG. 1 in accordance with an implementation.

Referring now to FIG. 3, an illustrative pulse sequence 300 is shown that can be used to acquire images using the MRI system 100. Specifically, a timing diagram for the example pulse sequence is indicated at 300. The timing diagram shows pulse or signal magnitudes, as a function of time, for a transmitted (RFt) signal, magnetic field gradients $G_x$, $G_y$, and $G_z$ and a received RFx signal. The example pulse sequence, simplified for illustrative purposes, contains a slice selection radio frequency pulse 310 at RFt, a slice selection gradient pulse 320 at Gz, a phase encoding gradient pulse 330 at Gy, a frequency encoding gradient pulse 340 at Gx, as well as a detected MR signal 350 at RFx. The pulses for the three gradients Gx, Gy, and Gz represent the magnitude and duration of the magnetic field gradients that are generated by the gradient coils 120. The slice selection pulse 310 is generated by the transmit aspect of RF coils 130. Detected MR signal 350 is detected by the receive aspect of the RF coils 130. In this illustrative example it is presumed that transmit aspect and receive aspect of RF coils 130 are formed by distinct coils.

The first event to occur in pulse sequence 300 is the slice selection gradient pulse 320. The slice selection RF pulse 310 is applied at the same time. Alternatively, the gradient pulse 320 may occur before or after the RF pulse 310. In this illustrative example, the slice selection RF pulse 310 may be a sinc function shaped burst of RF energy. In other implementations, other RF pulse shapes and durations may be used. Once the slice selection RF pulse 310 is turned off, the slice selection gradient pulse 320 is also turned off and a phase encoding gradient pulse 330 is turned on. Once the phase encoding gradient pulse 330 is turned off, a frequency encoding gradient pulse 340 is turned on and a detected MR signal 350 is recorded. It should be noted that the shapes, magnitudes and durations of the pulses and signals shown in FIG. 3 are chosen for illustrative purposes, and that in implementations, one or more of these factors and other signal factors may be varied to achieve the desired scan results.

In variations, the pulse sequence 300 can be repeated a certain number of times or iterations, typically 256 times, to collect all the data needed to produce one image. Each repetition typically involves variations in the pulse sequence to allow receiving signals corresponding to different components of the image. The time between each repetition of the pulse sequence 300 can be referred to as the repetition time (TR). Moreover, the duration between the center point of the slice selection pulse 310 and the peak of detected MR signal 350 can be referred to as echo time (TE). Both TR and TE may be varied as appropriate for a desired scan.

To further illustrate the signal acquisition process of MRI system 100, FIG. 2 is referred to in conjunction with FIG. 3. To select a slice, the slice selection gradient pulse 320 is applied along the Z-axis, satisfying the resonance condition for the protons located in the slice 205. Indeed, the location of the slice along the Z-axis is determined based, in part, on the slice selective gradient pulse 320. Accordingly, the slice selection pulse 310, generated at the same time (or at different time) as the slice selection gradient pulse 320 can excite protons that are located within the slice 205 in this example. Protons located above and below the slice 205 are typically not affected by the slice selection pulse 310.

Continuing with the illustrative example, in accordance with the pulse sequence 300, a phase encoding gradient pulse 330 is applied after the slice selection gradient pulse 320. Since the gradient pulse 330 creates a gradient in the magnetic field along the Y-axis, the spins at different locations along the Y-axis can begin to precess at different Larmor frequencies. When the phase encoding gradient pulse 330 is turned off, the net magnetization vectors at different locations can precess at the same rate, but possess different phases. The phases can be determined by the duration and magnitude of the phase encoding gradient pulse 330.

Once the phase encoding gradient pulse 330 is turned off, a frequency encoding gradient pulse 340 can be turned on. In this example, the frequency encoding gradient is in the X direction. The frequency encoding gradient can cause protons in the selected slice to precess at rates dependent on their X location. Accordingly, different spatial locations within the slice are now characterized by unique phase angles and precessional frequencies. RF receive coils 130 can be used to receive the detected signal 350 generated by the protons contained in the object being scanned while the frequency encoding gradient pulse 340 is turned on.

Figure 4:
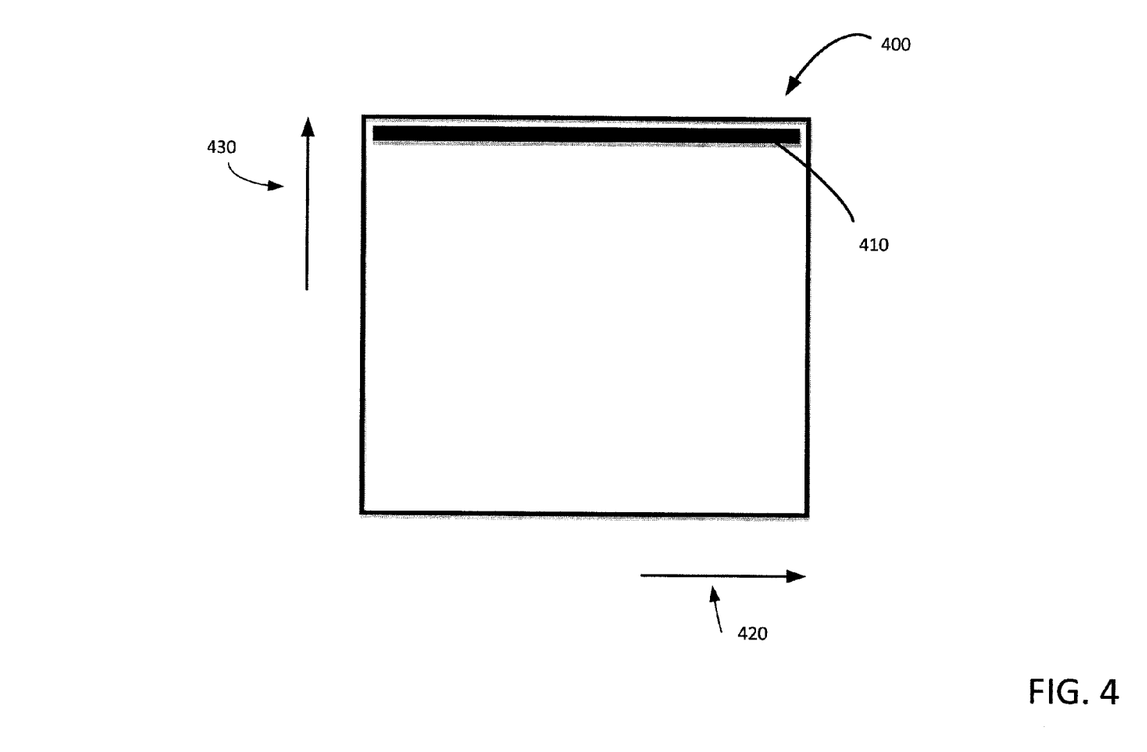
FIG. 4 shows a schematic representation of a k-space containing one line received using the MRI system of FIG. 1 in accordance with an implementation.

As the pulse sequence 300 is performed by MRI system 100, the acquired signals can be stored in a temporary matrix referred to as k-space, as shown in FIG. 4 at 400. Typically, K-space is the collection of the detected signals measured for a scan and is in the spatial frequency domain. K-space can be covered by frequency encoding data along the X-axis 420 (Kx) and phase encoding data along the Y-axis 430 (Ky) corresponding to the X (horizontal) and Y (vertical) axis shown in FIG. 2. When all the lines for the k-space matrix for a slice are received (at the end of the scan of a single slice, for example) the data can be mathematically processed, for example through a two-dimensional Fourier-transform, to produce a final image. Thus, k-space can hold raw data before reconstruction of the image into the spatial domain. In some cases, k-space can have the same number of rows and columns as the final image and be filled with raw data during the scan at a rate of one line per pulse sequence 300. For example, the first line of k-space 400, indicated at 410, can be filled after the completion of the first iteration of the pulse sequence generated for scanning a slice and contain the detected signal for that pulse sequence iteration. After multiple iterations of the pulse sequence, the k-space can be filled. Typically however, the final image will have more rows and columns than k-space, as discussed in greater detail below. Each iteration of the pulse sequence may be varied slightly, so that signals for the appropriate portions of the k-space are acquired. It should be noted that based on different pulse sequences, other methods of filling the k-space are possible, such as in a spiral manner, and are contemplated.

Figure 5:
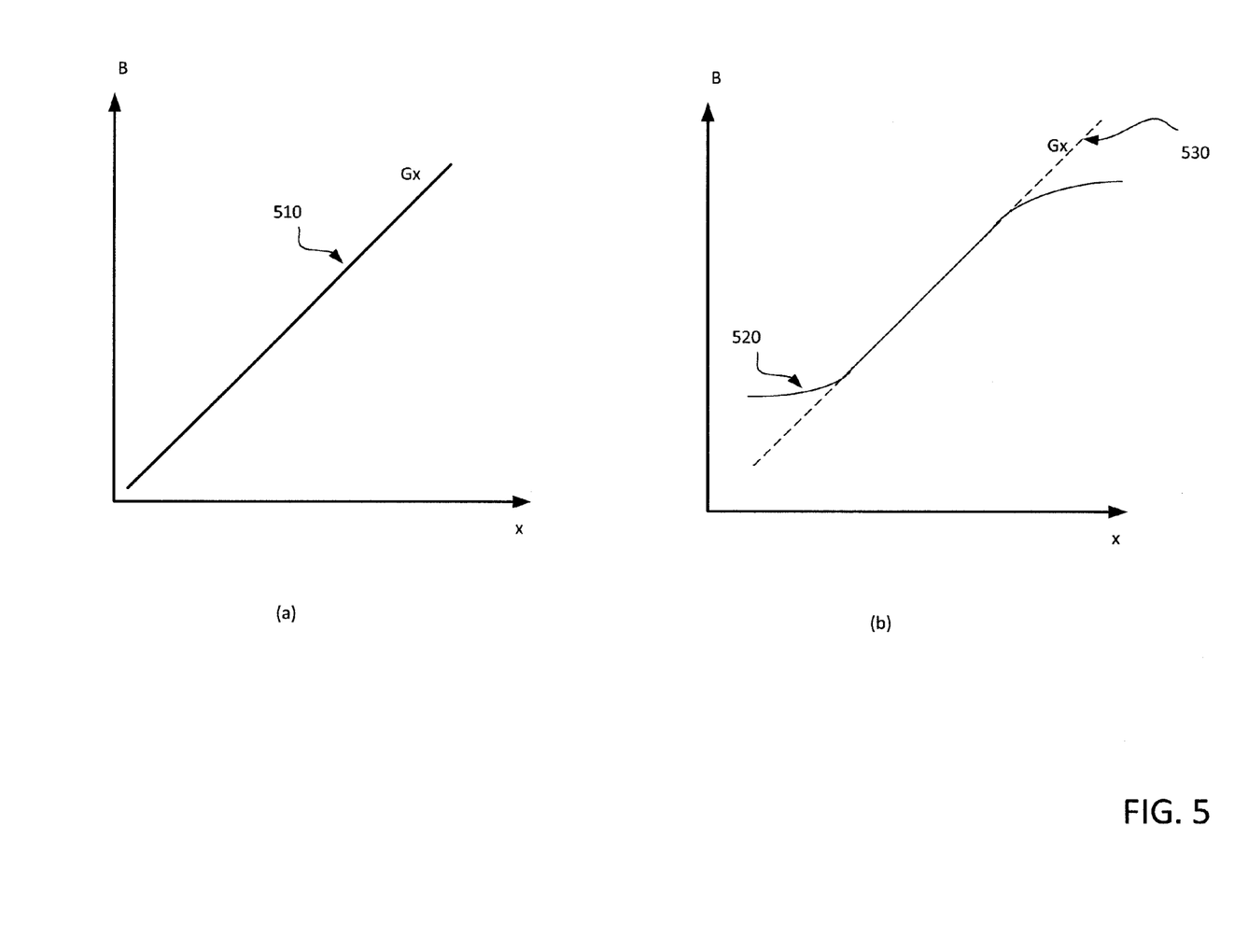
FIG. 5 shows example magnetic field profiles generated by gradient coils along one spatial dimension.

Typically, the gradient field profiles produced by gradient coils 120 include deviations from the profile of a linear field. As an illustrative example, ideally, as shown in FIG. 5(*a*), when a gradient field is applied along the X-axis by the gradient coils 120, the strength of the main magnetic field, indicated by B, profiled along the X-axis in space is linear and has a slope of Gx, which is the desired gradient generated by gradient coils 120 along the X-axis. As indicated in FIG. 5(*b*), at 520, however, the actual profile of the magnetic field strength deviates from the desired gradient Gx. In FIG. 5(*b*), the ideal gradient Gx is indicated with dotted lines at 530, for reference.

Figure 6:
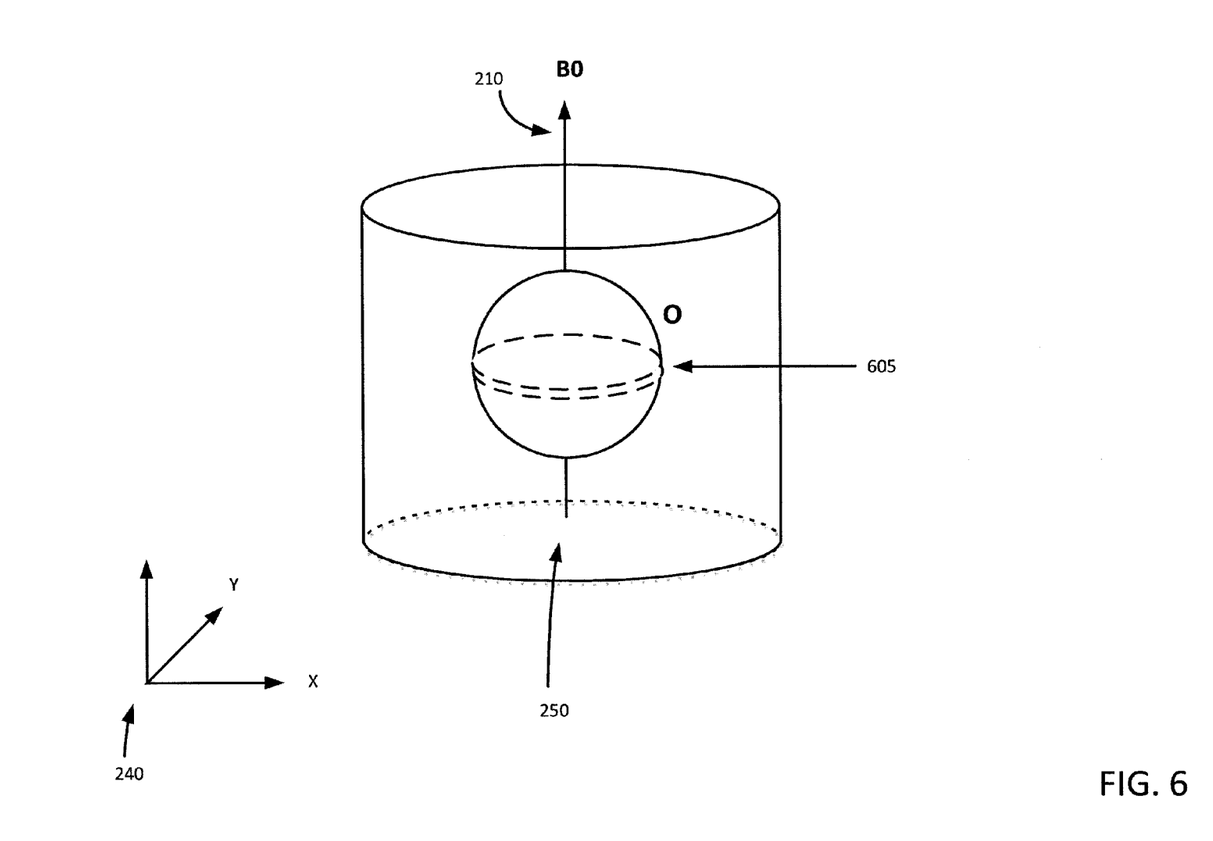
FIG. 6 shows an object to be scanned within an imaging volume.
Figure 7:
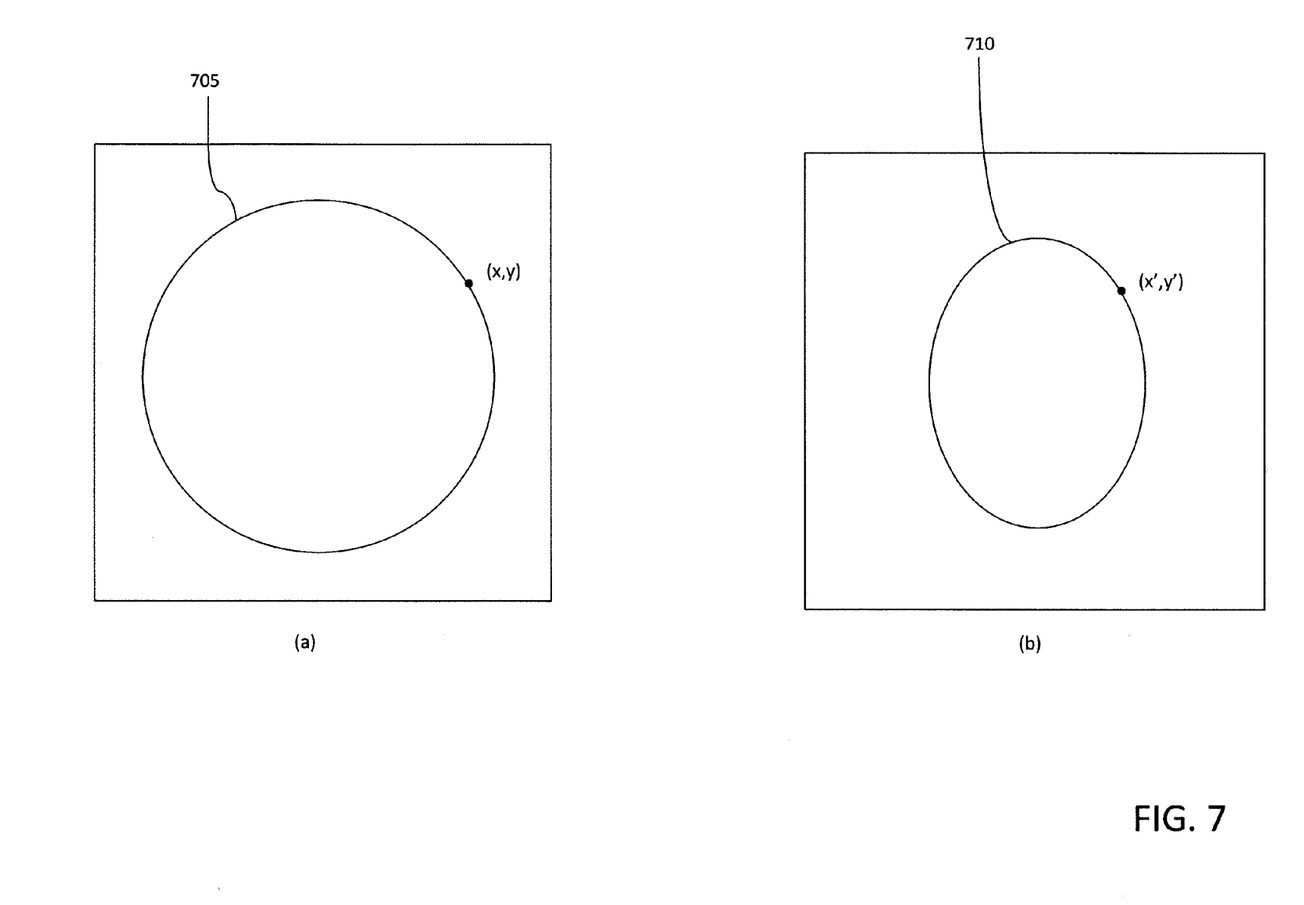
FIG. 7 shows an example image warping that can result from non-linearities in the magnetic fields generated by the gradient coils.

Deviations of the gradient field profiles from a linear profile typically lead to acquired images that are spatially warped. Referring to FIG. 6, imaging volume 250 of FIG. 2, is shown once again. In FIG. 6, however, an object O has been placed in the imaging volume 250, and an image of the slice 605 is acquired using the MRI system 100, in accordance with a pulse sequence, as described above, for example. The object O is presumed to be a spherical shell, which is chosen for illustrative purposes. Accordingly, in this illustrative example, the object O, when scanned along slice 605, should result in an image containing a circle 705, as indicated in FIG. 7(*a*), corresponding to the circumference of the spherical shell object O contained in the slice 605. However, the non-linearities in the gradient fields produced by gradient coils 120 result in a warping of the obtained image as shown in FIG. 7(*b*) at 710. The extent and shape of warping shown in FIG. 7(*b*) is a simplification chosen to merely illustrate the warping effect clearly.

Figure 8:
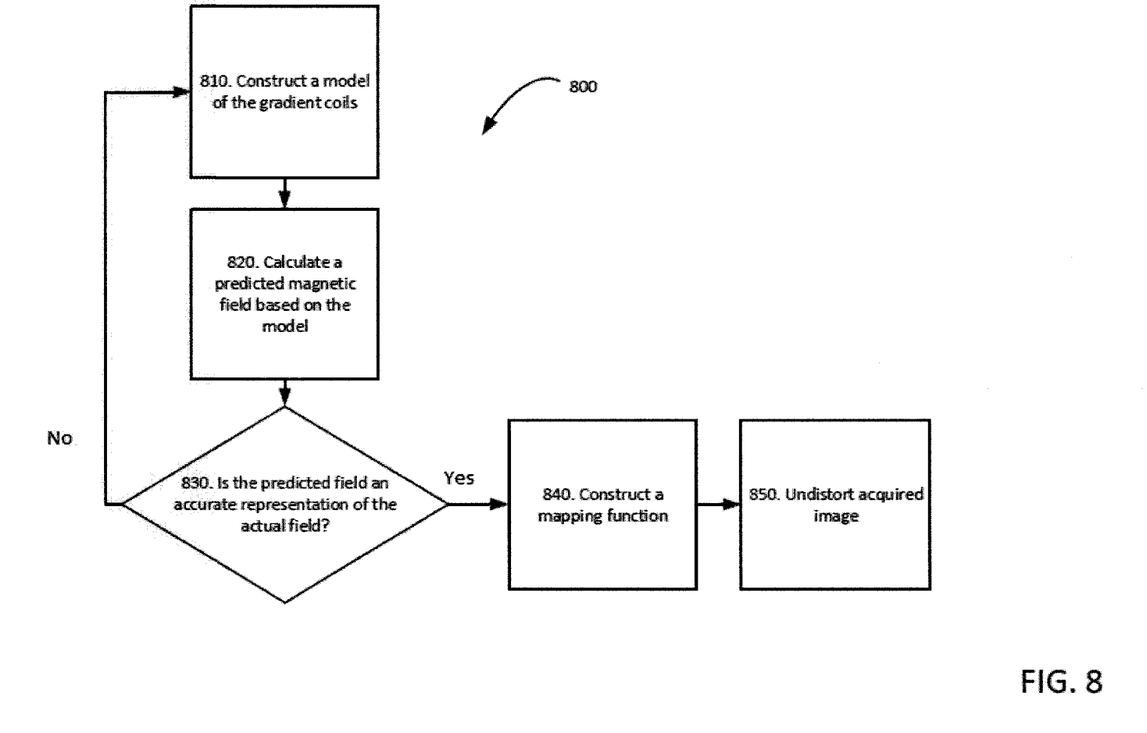
FIG. 8 shows a method of correcting spatial warping using the MRI system of FIG. 1 in accordance with an embodiment.

According to an aspect of the invention, the acquired images may be processed to correct for spatial warping caused by the non-linearities in the gradient field profiles. Referring now to FIG. 8, a method of correcting spatial warping is indicated generally at 800. In order to assist in the explanation of the method, it will be assumed that method 800 is in part operated using the MRI system 100 as shown in FIG. 1. Additionally, the following discussion of method 800 leads to further understanding of system 100. However, it is to be understood that system 100, and method 800 can be varied, and need not work exactly as discussed herein in conjunction with each other, and that such variations are within scope of the appended claims.

To correct for the spatial warping of images, a computer model of the gradient coils 120 is created at 810. The model represents the elements present in the gradient coils 120 such as the wire pattern of the coils present in the MRI system 100, including, for example, wire connections. For example, the model can include conductive elements of primary coils and, in variations, shield coils. The model is typically constructed to be as accurate a representation of the gradient coils 120 as possible based on computer modelling techniques. One example model is based on element arrays, that is, the electromagnet is modelled as a set of small current elements, which, when joined together, form the wire pattern of the electromagnet. The element array model may include connecting pathways of the gradient coils 120 as well as any other current carrying wires that are present in the gradient coils 120. Based on the element array model a complete spatial representation of the gradient coils 120 can be constructed. The element array model may include, for example, an array of conductive elements representing the wire patterns of the gradient coil 120.

Continuing with method 800, at 820, based on the model, a predicted magnetic field is calculated for each desired point in space for the gradient coils 120. The calculation of the predicted magnetic field may be based on various methods for calculating predicted magnetic fields from magnet models. For example, based on the element array model, appropriate form of Biot-Savart equations can be used to calculate a predicted magnetic field at each desired point in the imaging volume 250. In accordance with one implementation, Biot-Savart equations can take the form of the following formulation:

$$BP = \frac{\mu_0}{4\pi} \int \frac{I\vec{dl} \times \vec{r}}{|r|^3}$$

The formulation is used for computing the resultant magnetic field strength BP at position $\vec{r}$ generated by a steady current I (for example due to one conductive element of the element array model). $\vec{r}$ is the full displacement vector from the conductive element to the point at which the field is being computed and r is its magnitude. dl is a vector whose magnitude is the length of the differential element of the conductive element, in the direction of conventional current, and µ0 is the magnetic constant of permeability of free space.

The calculations, based on the Biot-Savart equations, can be performed as appropriate to compute the predicted magnetic field strength at each point in the imaging volume. In variations, different formulations of the Biot-Savart equations or other equivalent equations may be used to compute the predicted magnetic field based on the model of the gradient field coils 120. For example, the formulation given above works well when the current can be approximated as running through an infinitely-narrow wire. If the wires have some thickness, the formulation of the Biot-Savart equations may be altered accordingly. Although in this illustrative example, Biot-Savart equations are used, in variations, equivalent equations or formulations may be used to calculate the predicted magnetic field at each point in space.

Continuing with FIG. 8, at 830, the accuracy of the predicted magnetic field is verified by measuring the magnetic field produced by the actual constructed gradient coil. For example, the measurements can be done with a 3-axis Hall probe or other similar field measuring devices. The obtained measurements are compared to the predicted field values. When the measured and the predicted field values for the tested points in space are found to be in agreement, for example, within a predetermined threshold, the method continues to 840. When the measured and the predicted field values for the tested points in space are found not to be in agreement, however, the model is updated at 810, as appropriate to improve the accuracy of the model. In variations, the formulations and equations used may also be updated to improve the accuracy of the predicted magnetic field.

At 840, based on the predicted magnetic field, a distortion map (mapping function) is constructed, either by creating a map of values that can be interpolated between, or by calculating individual values as needed. For example, the following equations can be used to map coordinates in real space, for example the space of the object O, as shown in FIG. 6, to points in the warped space of an acquired image based on deviations of the gradient fields from linearity:

$$x' = \frac{B_z^x(x, y, z)}{G_x} = f_x(x, y, z)$$

$$y' = \frac{B_z^y(x, y, z)}{G_y} = f_y(x, y, z)$$

$$z' = \frac{B_z^z(x, y, z)}{G_z} = f_z(x, y, z)$$

Accordingly, a point x,y,z in the space of the object is mapped to a point x',y',z' of the image. B(x,y,z) values are obtained from the Biot-Savart equation for each gradient coil. $B^x$ is the z-component (or component coaxial with the main static field) of the predicted magnetic field strength for the gradient coils 120 produced along the X-axis, $B^y$ is the z-component of the predicted magnetic field strength for the gradient coils 120 produced along the Y-axis and $B^z$ is the z-component of the predicted magnetic field strength for the gradient coils 120 produced along the Z-axis. For example, referring to FIG. 7, the distortion map in effect, describes how the circle of FIG. 7(a), which corresponds to the object space, is mapped to the ellipse of FIG. 7(b). Accordingly, using the equations, point (x, y) in FIG. 7(a), for example, is determined to map to point (x', y') in FIG. 7(b).

Once the distortion map is obtained (at 840), an acquired image where the scanned objects appear in the distorted space, can be unwarped or distorted through interpolation based on the distortion map, at 850.

$$m_{unwarped}(x,y) = w(x',y') m_{warped}(x',y')$$

To determine the value of the unwarped image at location x,y, $m_{unwarped}(x,y)$, in real space, x' and y' are computed using the equations set forth above for constructing the distortion map. The field distortion maps can be used with a description of the slice selection pulse to determine the excited z location at each x,y location, as required for the evaluation of the equations referred to above. The value of the warped image at x',y', $m_{warped}(x',y')$ is computed by interpolating from neighboring x',y' locations corresponding to samples of $m_{warped}$ that are computed, for example, from Fourier Transforming the acquired k-space data. w(x',y') is a weighting valued applied at each (x',y') location to correct for signal pile up due to the change in voxel volume over the imaging volume. One way to compute. w(x',y') is as the ratio of the voxel volume in warped space at (x',y') to the voxel volume in real space at (x,y).

In effect, through unwarping, the obtained image is stretched or otherwise transformed such that the objects in the image are transformed into a space that corresponds more closely to the original object space. For example, through the interpolation, the warped image of FIG. 7(b) can be transformed back into a more circular shape with a size more closely corresponding to the actual circular cross-section of the spherical object O as indicated in FIG. 7(a).

The implementation of the distortion function can be carried out in image space, for example, using nearest neighbor, linear, or cubic interpolation methods (or other equivalent techniques). In addition to viewing the unwarping problem as interpolating values from a uniformly sampled grid of known values in warped image space, the problem can also be viewed as computing values of x', y' directly from k-space data:

$$m_{unwarped}(x,y) = w(x',y') \int m_{warped}(k_x',k_y') e^{j2\pi(xk_x'+yk_y')} dk_x' dk_y'$$

Where $m_{warped}(k_x',k_y')$ represents a collection of k-space data samples. This problem can be recognized as an inverse gridding problem or a non-uniform Fourier Transform, going from uniform to non-uniform sample locations. As such, it can be efficiently solved using an inverse gridding method, for example, by performing an apodization correction in k-space, followed by an Inverse Fourier Transform and then using convolution interpolation in image space with a Kaiser-Bessel kernel. Furthermore, it is recognized that with the inverse gridding approach to warping correction, the size of the Fourier Transform is determined by the k-space matrix size and an oversampling factor. The method of Beatty teaches that highly accurate results can be obtained with a minimal oversampling factor, e.g. 1.25-1.5.

As discussed above, MR images are typically reconstructed to a larger matrix size than the acquired matrix size. For example, a 320×192 acquisition matrix might be reconstructed to a 512×512 image size. This is typically performed by zero padding the k-space matrix and performing a 512×512 size Fourier Transform, followed by warping correction via image space interpolation. However, this operation can be more efficiently performed on a 1.25× oversampled grid, enabling a Fourier Transform of size 400×240 followed by interpolation (e.g. with a Kaiser Bessel kernel) onto a 512×512 image matrix. As a 400×240 matrix is over 2.7× smaller than a 512×512 matrix, this can result in significant computational and computer memory benefits, especially for larger zero padding factors. Additionally, it is recognized that for reconstructions involving multiple receiver channels, data can be combined across channels on the 400×240 matrix and the interpolation onto a 512×512 matrix only needs to be performed once per reconstructed image. This results in further efficiency benefits.

Figure 9:
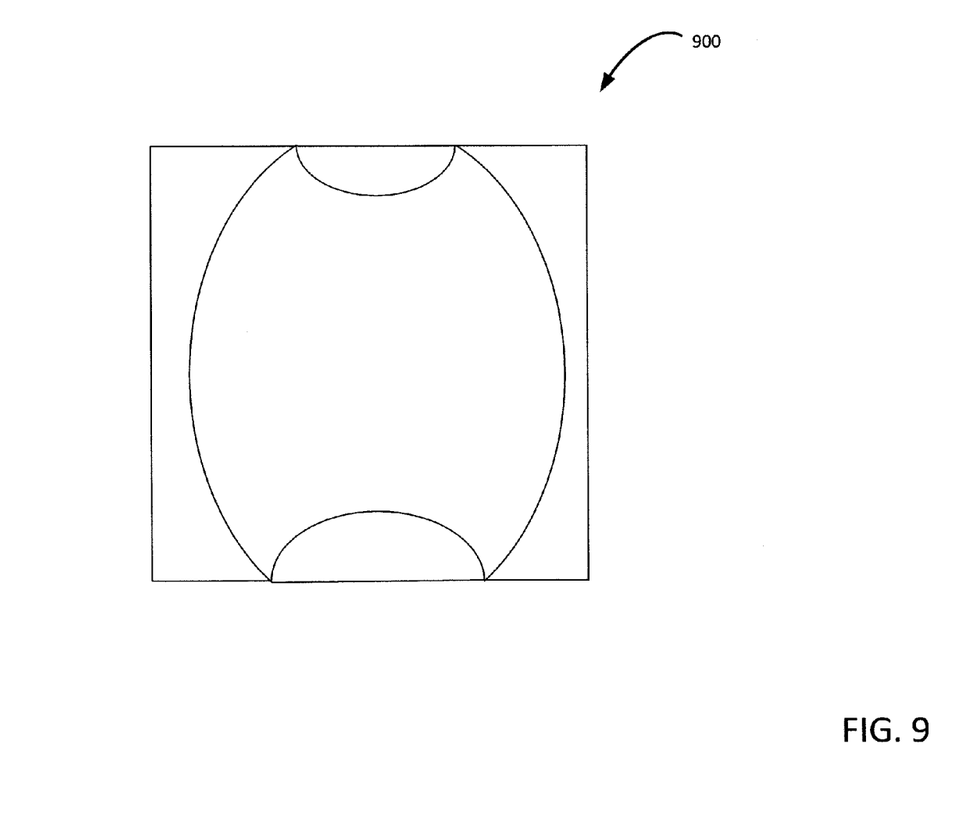
FIG. 9 shows an illustrative example of image aliasing in accordance with an embodiment.

In some variations, aliasing artifacts might occur where the portions of the object in the warped space are mapped beyond the boundaries of the field of view (FOV) of the image. For example, the object in the image can be distorted beyond the boundaries of the image, and can thus be folded back into the image in a manner that makes unwarping impractical. Aliasing artifacts become important when the object being imaged is close to the size of the field of view (FOV) of the image being acquired and/or when large gradient field non-linearities are present. If the warping is such that part of the object is warped to reside outside of the FOV, this can result in an aliasing artifact that cannot be readily removed. Referring to FIG. 9, 900 shows a simplified illustrative example of how scanning slice 605 of object O can result in an aliased image in the presence of a large gradient field non-linearities, for example.

The FOV for the image may be enlarged to avoid aliasing artifacts. Accordingly, in one variation, the maximum amount of expected distortion for a given FOV can be calculated based on the distortion maps. The calculated distortions can then be used to create an enlarged FOV. For example, in a case where x values for an image vary from 0 to 255, the transformation of x=0 and x=255 to their warped locations can be calculated based on the distortion map. These transformations can indicate how far outside the field of view (namely below 0 and above 255) the distortions in the X-axis can extend. Accordingly, the FOV can be increased to accommodate the transformations. Similarly, the object can be distorted to be smaller than the expected FOV. This will reduce the resolution of the image. Accordingly, the FOV can be reduced to improve image resolution. In general, the distortion maps can be used to find the smallest FOV in warped space that encompasses the prescribed FOV in real space. The resulting FOV in warped space can then be used in the creation of the pulse sequence.

In many cases, it is advantageous to enable the user to prescribe non-rectangular FOVs in real space (e.g. elliptical or rounded corner rectangles) to enable a smaller encompassing FOV in warped space.

Based on the determination of the enlarged FOV, the image of an object is acquired such that the acquired image has a larger FOV. For example, the k-space may be sampled more finely when acquiring the image for the actual object. For example, the k-space obtained for the object can be at a resolution of 512×512 in place of 256×256 at the same extent (i.e. same image resolution). During the unwarping process, the image can be returned to the user defined FOV. For example, once the unwarped image is obtained, it may be cropped as appropriate to the desired FOV.

Figure 10:
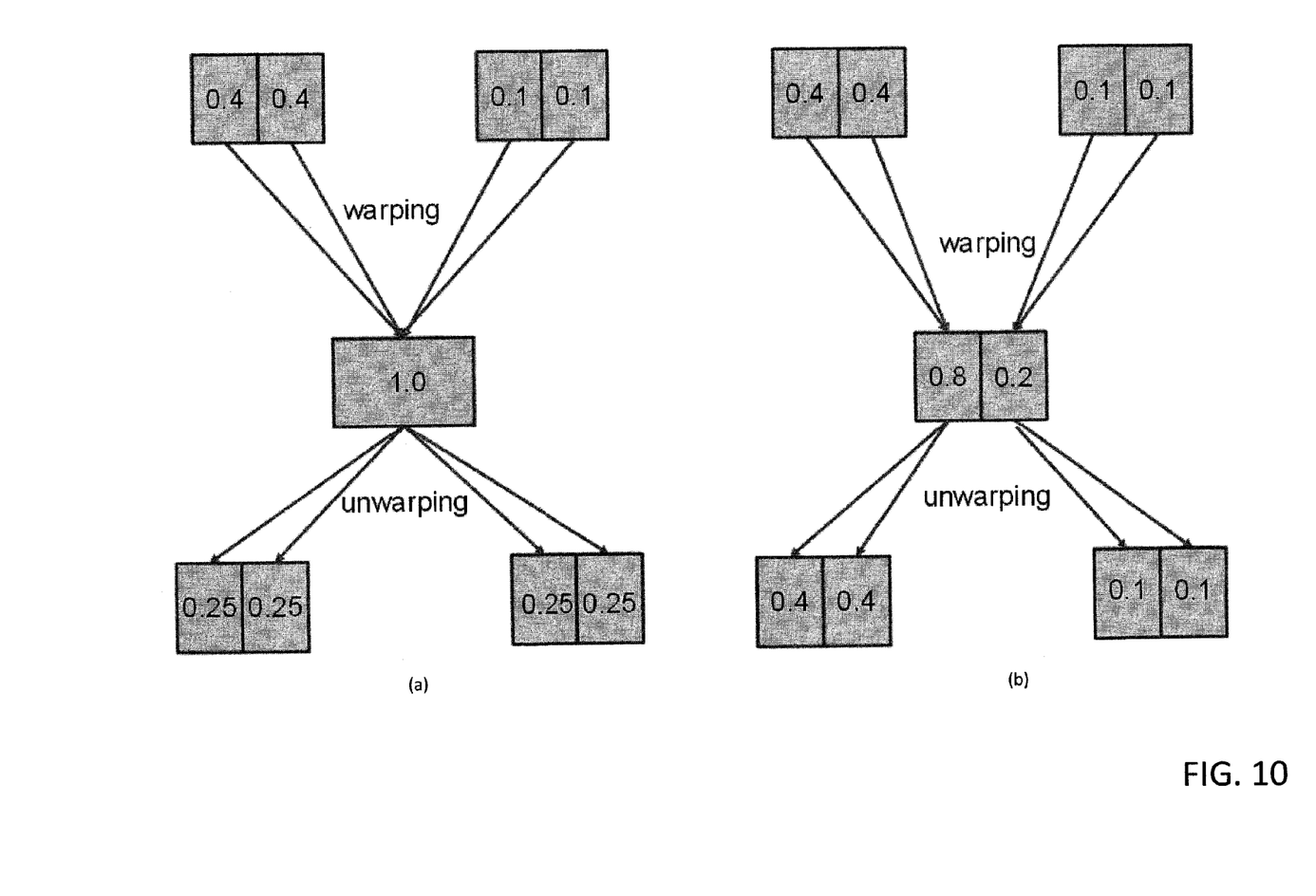
FIG. 10 shows the effects of voxel collapsing in accordance with an embodiment.

Artificially increasing image resolution may also aide in the ability to unwarp gradient inhomogeneities without incurring artifacts due to the collapsing of many voxels onto a single voxel in the warped image. For example, the acquired warped image may be increased to a higher sampling density, for example by zero padding the k-space of the warped image. Referring to FIG. 10, voxel collapsing is illustrated at FIG. 10(a). As can be seen warping and unwarping of the two voxels results in a loss of the intensity difference between the two voxels. On the other hand, as indicated at FIG. 10(b), with increased resolution, the loss can be reduced or avoided. This process can be particularly efficient when the unwarping function is carried out in the spatial frequency domain. This is because the formation of the highly sampled image can be avoided all together, saving computation time and memory; one must only add zeroes to the outer portion of the acquired k-space prior to convolution. Furthermore, it is straightforward at this stage to additionally apply an apodization function to the zero-padded k-space to aide in the removal of Gibb's ringing artifacts.

The above-described embodiments are intended to be examples and alterations and modifications may be effected thereto, by those of skill in the art, without departing from the scope which is defined solely by the claims appended hereto. For example, methods, systems and embodiments discussed can be varied and combined, in full or in part.

We claim:

1. A method of correcting warping of an acquired image in an MRI system, caused by non-linearities in gradient field profiles of gradient coils, comprising:
   a) constructing a computer model representing conducting pathways for each gradient coil in said MRI system;
   b) calculating a predicted magnetic field at each point in space for each said gradient coil in said model;
   c) measuring actual magnetic field at each point in space for each said gradient coil in said MRI system;
   d) verifying accuracy of said model by comparing said predicted magnetic field to said actual magnetic field at each said point in space and in the event said model is not accurate then repeating a)-d), and in the event said model is accurate then;
   e) constructing a distortion map for mapping coordinates in real space to coordinates in warped space of said acquired image based on deviations of said predicted magnetic field from linearity; and
   f) unwarping said warping of the acquired image using said distortion map,
      wherein said predicted magnetic field is calculated using one of either Biot-Savart equations or an equivalent thereof,
      wherein said distortion map is constructed for mapping each point x,y,z in real space to a point x',y',z' of the image in warped space by obtaining B(x,y,z) values from said Biot-Savart equations or equivalent for each said gradient coil,
      wherein values of x', y' are computed directly from k-space data using inverse gridding from uniform to non-uniform sample locations, and
      wherein said inverse gridding is effected by performing an apodization correction in k-space, followed by an Inverse Fourier Transform and then using convolution interpolation in image space with a Kaiser-Bessel kernel.

2. The method of claim 1, wherein said measuring is performed using a field measuring device.

3. The method of claim 2, wherein said field measuring device comprises 3-axis Hall probe.

4. The method of claim 1, wherein said computer model is an element array model of a gradient coil electromagnet comprising a set of elements joined together to form a spatial representation of a wire pattern for each said gradient coil.

5. The method of claim 1, wherein said Biot-Savart equations or equivalent comprise:

$$x' = \frac{B_z^x(x, y, z)}{G_x} = f_x(x, y, z)$$

$$y' = \frac{B_z^y(x, y, z)}{G_y} = f_y(x, y, z)$$

$$z' = \frac{B_z^z(x, y, z)}{G_z} = f_z(x, y, z)$$

and wherein f is a function of x, y, z, $B^x$ represents a component coaxial with a main static field of the predicted magnetic field produced along the X-axis of said MRI system, $B^y$ represents a component coaxial with the main static field of the predicted magnetic field produced along the Y-axis of said MRI system, and $B^z$ represents a component coaxial with the main static field of the predicted magnetic field produced along the Z-axis of said MRI system.

6. The method of claim 1, wherein said unwarping is performed in image space using one of either nearest neighbor, linear, or cubic interpolation.

7. The method of claim 1, wherein the size of the Fourier Transform is determined by the k-space matrix size and an oversampling factor.

8. The method of claim 7, wherein said Kaiser-Bessel kernel is pre-stored and re-sampled during interpolation.

9. The method of claim 1, further comprising adjusting a field of view of said acquired image by one of either enlarging or reducing the field of view to one of either eliminate aliasing artifacts that occur where portions of the image in warped space are mapped beyond the boundaries of the field of view of the image in real space or to improve image resolution.

10. The method of claim 9, wherein said enlarging comprises:
   calculating a maximum amount of expected distortion for said field of view using said distortion map; and
   using the calculated maximum amount of expected distortion to create an enlarged field of view.

11. The method of claim 9, further comprising generating a pulse sequence for said MRI system based on the adjusted field of view.

12. The method of claim 10, wherein said image is acquired according to the enlarged field of view by over sampling said k-space.

13. The method of claim 1, further comprising increasing the acquired image to a higher sampling density to avoid image artifacts resulting from collapsing a plurality of voxels onto a single voxel in said warped space.

14. The method of claim 13, wherein the acquired image is increased to a higher sampling density by zero padding said k-space.

15. The method of claim 13, wherein said zero-padding comprises adding zeroes to an outer portion of said k-space prior to said convolution.

16. The method of claim 15, further comprising applying an apodization function to the zero-padded k-space to aide in removal of Gibb's ringing artifacts.

\* \* \* \* \*